(12) United States Patent
Posseme

(10) Patent No.: US 9,780,191 B2
(45) Date of Patent: Oct. 3, 2017

(54) METHOD OF FORMING SPACERS FOR A GATE OF A TRANSISTOR

(71) Applicant: Commissariat A L'Energie Atomique et aux Energies Alternatives, Paris (FR)

(72) Inventor: Nicolas Posseme, Sassenage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/997,347

(22) Filed: Jan. 15, 2016

(65) Prior Publication Data

US 2016/0197160 A1  Jul. 7, 2016

Related U.S. Application Data

(63) Continuation-in-part of application No. 14/797,345, filed on Jul. 13, 2015.

(30) Foreign Application Priority Data

Jul. 18, 2014 (FR) ..................................... 14 56929
Jun. 19, 2015 (FR) ..................................... 15 55666

(51) Int. Cl.
*H01L 29/66* (2006.01)
*H01L 21/28* (2006.01)
(Continued)

(52) U.S. Cl.
CPC .... *H01L 29/6653* (2013.01); *H01L 21/02252* (2013.01); *H01L 21/265* (2013.01);
(Continued)

(58) Field of Classification Search
None
See application file for complete search history.

(56) References Cited

U.S. PATENT DOCUMENTS

2004/0014305 A1   1/2004   Haselden et al.
2004/0175955 A1   9/2004   Haselden et al.
(Continued)

FOREIGN PATENT DOCUMENTS

EP   2 750 170 A1   7/2014

OTHER PUBLICATIONS

French Preliminary Search Report issued Feb. 20, 2015 in French Application 14 56929, filed on Jul. 18, 2014 ( with English Translation of Categories of Cited Documents and Written Opinion).

(Continued)

*Primary Examiner* — Jiong-Ping Lu
(74) *Attorney, Agent, or Firm* — Oblon, McClelland, Maier & Neustadt, L.L.P.

(57) ABSTRACT

The invention describes a method for forming spacers (152a, 152b) of a field effect transistor gate, comprising a step of forming a protection layer (152) covering the gate of said transistor, at least a step of modifying the protection layer, executed after the step of forming the protection layer, by contacting the protection layer (152) with plasma comprising ions heavier than hydrogen and CxHy where x is the proportion of carbon and y is the proportion of hydrogen to form a modified protection layer (158) and a carbon film (271). The protection layer being nitride (N)-based and/or silicon (Si)-based and/or carbon (C)-based and shows a dielectric constant equal or less than 8.

42 Claims, 7 Drawing Sheets

(51) Int. Cl.

| | | |
|---|---|---|
| *H01L 21/02* | (2006.01) | |
| *H01L 21/8234* | (2006.01) | |
| *H01L 21/8238* | (2006.01) | |
| *H01L 21/265* | (2006.01) | |
| *H01L 21/3065* | (2006.01) | |
| *H01L 21/31* | (2006.01) | |
| *H01L 21/311* | (2006.01) | |
| *H01L 21/3115* | (2006.01) | |
| *H01L 29/51* | (2006.01) | |
| *H01L 29/16* | (2006.01) | |
| *H01L 21/84* | (2006.01) | |

(52) U.S. Cl.
CPC .. *H01L 21/28123* (2013.01); *H01L 21/28141* (2013.01); *H01L 21/30655* (2013.01); *H01L 21/31* (2013.01); *H01L 21/31111* (2013.01); *H01L 21/31116* (2013.01); *H01L 21/31138* (2013.01); *H01L 21/31144* (2013.01); *H01L 21/31155* (2013.01); *H01L 21/823468* (2013.01); *H01L 21/823821* (2013.01); *H01L 21/823864* (2013.01); *H01L 21/84* (2013.01); *H01L 29/16* (2013.01); *H01L 29/518* (2013.01); *H01L 29/6656* (2013.01); *H01L 29/66772* (2013.01); *H01L 29/66795* (2013.01)

(56) References Cited

U.S. PATENT DOCUMENTS

| | | | |
|---|---|---|---|
| 2007/0232006 A1* | 10/2007 | Hellmich | H01L 21/31116 438/300 |
| 2013/0252430 A1 | 9/2013 | Ranjan et al. | |
| 2014/0187046 A1* | 7/2014 | Posseme | H01L 21/0217 438/696 |
| 2014/0273292 A1* | 9/2014 | Posseme | H01L 21/3065 438/5 |

OTHER PUBLICATIONS

Romuald Blanc et al. "Patterning of silicon nitride for CMOS gate spacer technology .I. Mechanisms involved in the silicon consumption of CH3F/O2/He high density plasmas", Journal of Vacuum Science and Technology, vol. 31, No. 5, 2013, 5 pages.

* cited by examiner

PRIOR ART

METHOD OF FORMING SPACERS FOR A GATE OF A TRANSISTOR

TECHNICAL FIELD OF THE INVENTION

The present invention generally relates to field effect transistors (FET) used by the microelectronics industry and more particularly the production gate spacers for transistors of the metal-oxide-semi-conductor (MOSFET) type, most often contact holes, mainly used for the production of all kinds of integrated circuits.

STATE OF THE ART

The relentless race for a reduction in the dimensions that characterizes the whole microelectronics industry could be achieved only with the constant improvement of key innovations throughout decades of development since the first integrated circuits were produced industrially in the sixties. A very important innovation which dates back to the seventies, and which is still used nowadays, consists in making the MOSFETs using a technique in which the source and drain electrodes are self-aligned on gate ones and so require no photo-etching operation for the definition thereof. Combined with the use of polycrystalline silicon gates, the gates themselves are produced first, and are used as masks during the doping of the source and drain zones of the transistors.

FIG. 1 is a cross-sectional view of an exemplary transistor 100 being produced. It contains the source and drain zones 110, generally designated source/drain zones, since they are usually perfectly symmetrical and can play both roles depending on the electric polarisations that are applied to the transistor. The gate conventionally comprises a stack of layers 120 a large part of which is still made of polycrystalline silicon 123. The source and drain zones are typically formed by ionic implantation 105 of dopants in the zones 110, with the gate 120 being used as masks as mentioned above, thereby preventing doping the MOSFET transistor zone wherein the conduction channel 130 between source and drain will be able to develop, depending on the voltages applied to the gate.

The basic technique, briefly described above, is well known to those skilled in the art as well as many alternative solutions thereof, and has been constantly enhanced in order to improve the electrical performances of the transistors while making it possible to accommodate the successive reductions in the transistor sizes required by an ever-increasing integration of a greater number of components into an integrated circuit.

A currently widely used technique consists in producing the integrated circuit from complex substrates 140 of the silicon on insulator type. The complex SOI substrate is characterized by the presence of a thin surface layer 146 of single-crystal silicon supported by a continuous layer 144 made of silicon oxide, also called buried oxide or still BOX, the acronym for « buried oxide layer ». The mechanical solidity and rigidity of the assembly are provided by the layer 142 composing the body of the SOI substrate, also defined as « bulk » so as to indicate that the starting substrate is generally made of solid silicon. Such structure is very advantageous for the production of MOSFET transistors. It more particularly enables a drastic reduction of stray capacities because of the presence of the continuous insulating layer 144. As for the invention, it should only be reminded that the single-crystal silicon surface layer 146 can be precisely controlled as regards thickness and doping. In particular, it is advantageous for the performances of the transistors that the channel 130 can be completely deprived of carriers, i.e. "fully depleted" (FD), as such state is generally referred to. This is obtained by producing transistors from 501 substrates the surface layer 146 of which is very thin which may be disadvantageous, as will be seen in the description of the invention. Such type of transistor is thus designated by the acronym FDSOI.

An improvement of the self-aligning basic technique that has been universally adopted consists in forming spacers 150 on the flanks of the gate. The spacers 150, typically made of silicon nitride (SiN), will enable in particular the implementation of a so-called "raised Source and Drain" technique. To keep low electrical resistances of access to the source and drain electrodes, in spite of the reduction in size of the transistors, the sections thereof had to be increased. This is obtained by selective epitaxy of source/drain zones 110. During such operation the initial single-crystal silicon layer 146 will be locally grown. Gate zones must be protected then to prevent growth from the polycrystalline silicon 123 of the gate. This function is ensured, among others, by the spacers. They also ensure the preservation of the gate 120 during the contacts siliconizing (not shown) which is then executed so as to reduce the series resistance of access to the electrodes of the transistor 100.

Forming spacers 150 is then a crucial step of forming the transistors, which now reach dimensions currently measured in nanometers (nm=$10^{-9}$ meters) and which globally have decananometric sizes. No photo-etching operation is executed for producing the spacers. They are self-aligned with the gate 120 from the deposition of a uniform silicon nitride layer 152 (SiN) which then undergoes a much anisotropic etching. Such etching of the SiN preferentially attacks the horizontal surfaces, i.e. all the surfaces which are parallel to the plane of the SOI substrate. It only, and imperfectly, leaves the vertical parts of the layer 152, those substantially perpendicular to the plane of the substrate, so as to obtain, in practice, the patterns 150 the ideal shape of which would of course be rectangular.

With the known solutions, the reduction in size of the transistors results in the obtaining of spacers which fully ensure insulation and induce no defects in the production of transistors from SOI substrates becoming a very delicate operation. As a matter of fact, within the scope of the present invention, and as will be explained in greater details hereunder, it could be noted that several types of defects, such as the ones mentioned hereunder, occur during the etching of spacers, while using one or the other known anisotropic etching methods.

FIGS. 2a, 2b and 2c each illustrate a type of defect detected.

A so-called « dry » etching is used, which is implemented using a method generally referred to by its acronym RIE « reactive-ion etching ». In such etching method, plasma which physically and chemically reacts with the surface of the wafer to be etched is formed in a confined enclosure, also referred to as chamber. When etching a silicon nitride layer, which is the preferred material for producing spacers, as mentioned above, the reactive gas is typically methyl fluoride (CH3F) which reacts with the material to be etched after introducing dioxygen (O2). Fluorine chemistry-based etching plasma is thus formed and is often designated by its constituents: CH3F/O2/He. Such plasma fluorine compound is used to etch silicon nitride whereas oxygen makes it possible to limit the polymerisation of methyl fluoride and is also used to oxidise silicon when such material is reached during etching. The oxide layer formed on silicon makes it possible to slow down the etching of silicon, but the price to pay is the transformation of the surface oxide thereof and thus a surface consuming of silicon. Helium is used as a thinner for oxygen.

Such type of etching is advantageous in that it is anisotropic enough and makes it possible to sufficiently control the profiles of the spacers 150 even though the ideal rectangular shape cannot be reached in practice. Such type of etching is disadvantageous in that the selectivity of etching the underlying silicon is limited. Selectivity, i.e. the ratio of etching speed between silicon nitride and silicon is about 10 and may reach a maximum of 15 depending on the plasma forming conditions (nitride is etched 10 to 15 times quicker than silicon).

So called hydrofluoric acid (HF)- or phosphoric acid (H3PO4)-based « wet » etching is also used, the latter in particular for the SiN or the SiC, with a much better selectivity, respectively, to silicon or silicon oxide (SiO2) but the profile of the spacers cannot be controlled since etching is mainly isotropic in this case. This etching type is called "wet clean".

It should be noted here that many publications exist about etching silicon nitride and/or gate spaces in general. Reference will be made to the following American patents or patent applications: 2003/0207585; U.S. Pat. Nos. 4,529,476; 5,786,276 and 7,288,482.

FIG. 2a illustrates a first problem relating to insufficient selectivity of attack existing during dry etching of the CH3F/O2/He type between silicon nitride and silicon on the surface layer 146. The result is that a significant part of the thin single-crystal silicon surface layer 146 of the SOI substrate can then be partially consumed 147 during the anisotropic etching of nitride. As mentioned above, the surface layer 146 is so selected as to have a low thickness, in order to enhance the electrical characteristics of the transistors. It is typically of less than 10 nm. The remaining thickness 145 may be very low. Under such conditions the following ionic implantation 105 for forming the source and drain zones 110 may significantly damage the remaining single-crystal silicon. The implantation energy of dopants may be sufficient to cause a complete amorphisation 149 of the single-crystal silicon, which will then deeply affect specifically the following step of epitaxial growth 12 intended to form the raised source/drain. As mentioned above, the latter operation is required because of the reduction in the size of the transistors so that the resistances of access to the source and drain electrodes can be kept at sufficiently low values not to impact the electrical operation of the transistors. Growth from a silicon layer partially or totally made amorphous will cause many defects in the layer formed by epitaxy.

FIG. 2b illustrates another problem, wherein no significant consuming of the silicon of the surface layer 146 occurs, but « feet » 154 are formed at the lower part of the silicon nitride patterns remaining on the flanks of the gate after etching. The transition 114 of the junctions formed after doping by ionic implantation 105 of the source and drain zones 110 with the channel zone 130, is consequently much less rough than when the spacers have no feet, as shown in the previous figures. The presence of feet 154 affects the electrical characteristics of the transistors. It should be noted here that the forming or not of feet at the feet of the spacers and the consuming or not of the silicon of the silicon surface layer 146 of the SOI substrate, described in the previous figure, are etching antagonist adjustment parameters which require a compromise to be reached wherein, ideally, no feet are formed and the silicon surface layer is not significantly attacked.

FIG. 2c illustrates a third problem which arises when etching causes too important erosion of the spacers in the higher parts of the gates and exposes polycrystalline silicon 123 in such zones 156. This results in the subsequent epitaxial growth 112 aiming at forming raised source/drain also occurring at such places, as well as stray contacts being siliconized, which might cause short-circuits between the electrodes. As a matter of fact, etching spacers requires adjusted etching time to etch 150% of the thickness of deposited nitride, for instance. This means that 50% (here) over-etching is executed so as to take into account the non-uniform deposition, or the etching operation proper, on the wafer. Too important over-etching, which exposes the gate zones 156 can thus be noted in some parts of the wafer. Such defect is also called « facetting ».

Besides, providing a protective layer, often based on carbon, such as a mask or a photo-sensitive or thermo-sensitive resin may be required in some applications so as to protect structures formed on the substrate when etching the spacers. This is the case, for instance, when producing PMOS transistors, very similar to NMOS transistors, the spacers of which are being produced. Known etching methods may lead to a significant consuming of such protective layer when etching the spacers of the PMOS transistor.

The aim of the present invention is to provide a method for forming spacers used as insulators which would eliminate or at least reduce some defects in the production of transistors, such as consuming or damaging the semi-conductor material (i.e. Si, SiGe) of the active layer, forming « feet » at the lower part of the patterns on the flanks of a transistor gate, consuming a carbon-based protective layer, etc.

Other objects, characteristics and advantages of the present invention will become apparent upon examining the following description and the appended drawings. It should be understood that other advantages can be incorporated herein.

SUMMARY OF THE INVENTION

To reach this goal, one aspect of the present invention relates to a method for forming the spacers of a field effect transistor gate, with the gate being positioned above an active layer made of a semi-conductor material, comprising: a step of forming a protection layer covering the gate of said transistor; at least one step of modifying the protection layer, produced after the step of forming the protection layer, by contacting the protection layer with plasma comprising ions heavier than hydrogen and CxHy, where x is the proportion of carbon and y is the proportion of hydrogen so as to form a modified protection layer and to form a carbon-containing film such as a carbon film.

Advantageously, the protection layer is a nitride (N)-based layer and/or a silicon (Si)-based layer and/or a carbon (C)-based layer.

Advantageously, the dielectric constant of the protection layer is equal or less than 8 and preferably equal or less than 7.

The step of modifying is so executed that plasma creates an anisotropic bombardment with hydrogen-based ions resulting from CxHy, in a main direction of implantation parallel to flanks of the gate and so as to form a modified protection layer by modifying the portions of the protection layer located at the top of the gate and on both sides of the gate, so as to keep non-modified portions, or at least not modified on the whole thickness of the protection layer covering the flanks of the gate.

The hydrogen-based ions are preferably selected among: H, $H^+$, $H_2^+$, $H_3^+$.

A carbon-containing film is a film comprising chemical species containing carbon. It may be a carbon layer. According to one not restrictive embodiment the carbon-containing film is made of carbon. Advantageously, the carbon-containing film can help to protect the flanks of the gate during the bombardment by preventing hydrogen or heavy ions from modifying the protection layer or from modifying the whole thickness of the protection layer.

The step of modifying is so executed as to form a carbon-containing film, specifically on surfaces parallel to the bombardment direction.

In a very advantageous way, the carbon-containing film helps to protect the non-modified protection layer at the level of the flanks during the etching of the protection layer modified by HF for example.

The step of modification is so executed to form a carbon-containing film particularly on surfaces parallel to main direction of implantation also called direction of bombardment.

The method also comprises at least a step of removing the modified protection layer using a selective etching of the modified protection layer relative to the carbon-containing film and relative to non-modified portions of the protection layer.

Said non modified portions may thus also constitute the spacers for the gate.

Particularly advantageously, it has been noted that the bombardment with ions heavier than hydrogen such as He enables the—plasma chemical species containing carbon resulting from CxHy to form a protective carbon-containing film specially on surfaces parallel to the direction of the bombardment and while preventing such carbon-containing chemical species from forming a carbon-containing film on the surfaces of the protection layer which are perpendicular to the direction of the bombardment.

As a matter of fact, the bombardment with ions heavier than hydrogen destroys the carbon-containing film which would tend to deposit onto the surfaces perpendicular to the bombardment direction.

During the step of removing, such etching consumes the surfaces of the modified protection layer which are not covered with the carbon-containing film.

It is thus possible to protect a structure whereon the carbon-containing film is formed.

It has been noted though that the ionic bombardment does not prevent forming such carbon-containing film when a layer comprising carbon and plasma are contacted. The carbon-containing film is then used as a protective film which prevents the modification of the carbon layer covered with the film. Besides, as etching is selective to modified protection layer relative to carbon, the carbon-containing film formed on the carbon layer protects the latter during the step of removing.

Particularly advantageously, modifying the protection layer using hydrogen (H)-based ions leads to implanting such hydrogen-based ions into the aimed layers. Such modification using ion implantation makes it possible to significantly improve the selectivity of the etching of such layer relative to the semi-conductor material, typically silicon. Such implantation also results in the thickness of modified protection layer being more quickly etched than the non-modified protection layer.

Etching thus consumes the modified protection layer rather than the semi-conductor material layer and the non-modified portions of the protection layer. Thus, the risk of excessive consuming of the semi-conductor material surface layer is reduced or even eliminated.

Modifying the protection layer preferably preserves a partial or complete thickness of non-modified protection layer on the flanks of the gate. Such thickness is at least partially preserved during the selective etching. Then it defines gate spacers.

Furthermore, the carbon-containing film helps to protect the non-modified protection layer at the level of the flanks during the etching of the modified protection layer.

The invention thus makes it possible to obtain spacers while reducing or even eliminating the problems of the known solutions and mentioned above. This is more particularly true if a layer or a block comprising carbon is present. Such carbon-based layer is not consumed by etching. It may be a carbon hard mask, for instance. It may also be a carbon-based resin so positioned as to protect a structure produced beforehand from etching and plasma.

The advantage of implanting from plasma comprising said hydrogen-based ions is that it enables a continuous implantation into a volume extending from the surface of the implanted layer.

Besides, using plasma enables an implantation at lower depths than the minimum depths which can be obtained with implanters. Thus, an implantation with plasma makes it possible to efficiently and relatively homogeneously or at least continuously implant thin thicknesses which can then be removed with a selective etching. Such continuous implantation from the implanted face makes it possible to enhance the homogeneity of the modification according to the depth, which leads to a time-constant speed of etching of the implanted layer. Besides, the increase in the selectivity conferred by the implantation as compared to other layers is effective as soon as etching of the implanted layer is started. Plasma implantation also enables a significantly enhanced control of etching accuracy.

The plasma implantation typically makes it possible to implant then to remove thicknesses extending from the surface of the implanted layer and on a depth ranging from 0 nm to 100 nm. Conventional implanters, enable an implantation in a volume ranging from 30 nm to several hundreds of nanometers. However, conventional implanters do not make it possible to implant the species between the surface of the layer to be implanted and a depth of 30 nm. When developing the present invention, it has been noted that the implanters do not make it possible to obtain a sufficiently constant speed of etching of the modified protection layer, from the surface of the latter, thus leading to less etching accuracy compared to what the invention enables.

Using plasma to modify the portion to be removed is thus particularly advantageous within the scope of the invention which aims at removing a thin thickness of the protection layer, typically between 1 and 10 nm and more generally between 1 and 30 nm.

The step of modifying executed from plasma modifies the protection layer continuously from the surface of the protection layer and on a thickness ranging from 1 nm to 30 nm and preferably from 1 nm to 10 nm.

Also advantageously, modifying the protection layer by implanting hydrogen-based ions also makes it possible to enhance the selectivity of such modified protection layer relative to the oxide of the semi-conductor material. Typically, in the case of a FinFET transistor, the modified protection layer is removed from the fins whereas the gate oxide is not or less consumed.

During the steps of modifying the conditions of plasma, more particularly the concentration of CxHy, the ion energy and the main implantation direction are thus so chosen that:

plasma creates an anisotropic bombardment with hydrogen (H)-based ions from CxHy, in a favorite or main direction parallel to flanks of the gate and so as to modify portions of the protection layer outside the flanks of the gate and while keeping non-modified portions, or at least not modified on the entire thickness, of the protection layer covering the flanks of the gate.

plasma chemical species containing carbon from CxHy form a carbon-containing film specifically on surfaces parallel to the bombardment direction;

plasma creates a bombardment with ions heavier than hydrogen which prevents said—plasma chemical species containing carbon from CxHy from forming a carbon-containing film, more particularly on the surfaces of the protection layer which are perpendicular to the direction of the bombardment.

Optional characteristics which may be used in association or alternately with the above characteristics are enumerated hereunder:

The bombardment with ions heavier than hydrogen (hereafter called "heavy ions"), more particularly the energy, the direction and the fluence thereof are provided so that the carbon-containing film forms on the surfaces parallel to the implantation direction and so that the carbon does not form on the surfaces of the protection layer which are perpendicular to the implantation direction. More precisely, the ionic bombardment very anisotropically consumes the carbon-containing chemical species which are deposited onto the bottom of the structures. Bombardment in a direction perpendicular to the implantation direction (i.e. at the level of the flanks) is very low. The ion energy is thus not sufficient to prevent such carbon-containing film from forming.

The method advantageously but not restrictively comprises, prior to the step of modifying and preferably after the step of forming the protection layer, a step of depositing a carbon-containing layer.

The carbon-containing film acts as a protective film for the carbon layer preventing or reducing the modification of the latter as a result of the ionic bombardment. The carbon layer can possibly be modified during the step of modifying, but is not removed by the HF.

Such carbon-containing layer is different from the transistor for which the spacers are produced.

Such carbon-containing layer for example forms a block for masking a previously produced structure.

It could be noted that, when selecting the ion energy and the density of CxHy, the carbon layer is not significantly modified by implanting ions heavier than hydrogen even on the surfaces perpendicular to the main bombardment direction. It could be noted that the carbon from CxHy reacts with the carbon in the carbon-containing layer to form, on the surface, a sufficiently dense and thick carbon layer to resist the bombardment with ions, even on the surfaces of the carbon layer which are perpendicular to the main (favorite) bombardment direction.

More precisely, thanks to chemical affinities between the carbon-containing layer and the carbon of plasma, the latter quickly deposits onto the carbon-containing layer before being pulverised. Such chemical affinities make it possible to quickly reach a deposition rate and the carbon-containing layer is thus not consumed.

The invention is thus particularly advantageous for producing different structures on the same substrate, for instance a NMOS transistor adjacent to a PMOS transistor.

The layer comprising carbon is preferably a layer of photo-sensitive or thermo-sensitive resin. A NMOS transistor may for instance be covered with a carbon-based resin whereas a PMOS transistor is not covered with resin. The resin protects the NMOS transistor during the step of modifying and etching the protection layer of the PMOS transistor.

In another embodiment, such layer comprising carbon is a hard mask preferably formed with carbon.

In an advantageous embodiment, said layer comprising carbon is so configured as to cover the structure different from said transistor, with said structure and said transistor being on the same substrate.

Said structure is preferably located above said active layer made of a semi-conductor material.

Said transistor is preferably a NMOS transistor and said structure is a PMOS transistor. In another preferred embodiment, said transistor is a PMOS transistor and said structure is a NMOS transistor.

During the step of modifying executed by contacting the protection layer with plasma comprising CxHy, the carbon-containing film preferably covers the walls of the layer comprising carbon, with the thickness e2 of the carbon-containing film covering the walls of the layer comprising carbon being higher than the thickness e1 of the carbon-containing film at the level of the flanks of the gate.

The carbon-containing film having a thickness e2 thus resists the bombardment with ions, which makes it possible to protect the layer comprising carbon during the step of modifying as well as during the step of removing. Besides, the step of removing thus does not result in consuming the layer comprising carbon.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIGS. 5a, 5c to 5e respectively illustrate a structure of a transistor obtained upon completion of the steps of the method according to one embodiment different from the two embodiments illustrated above.

Figure 1:
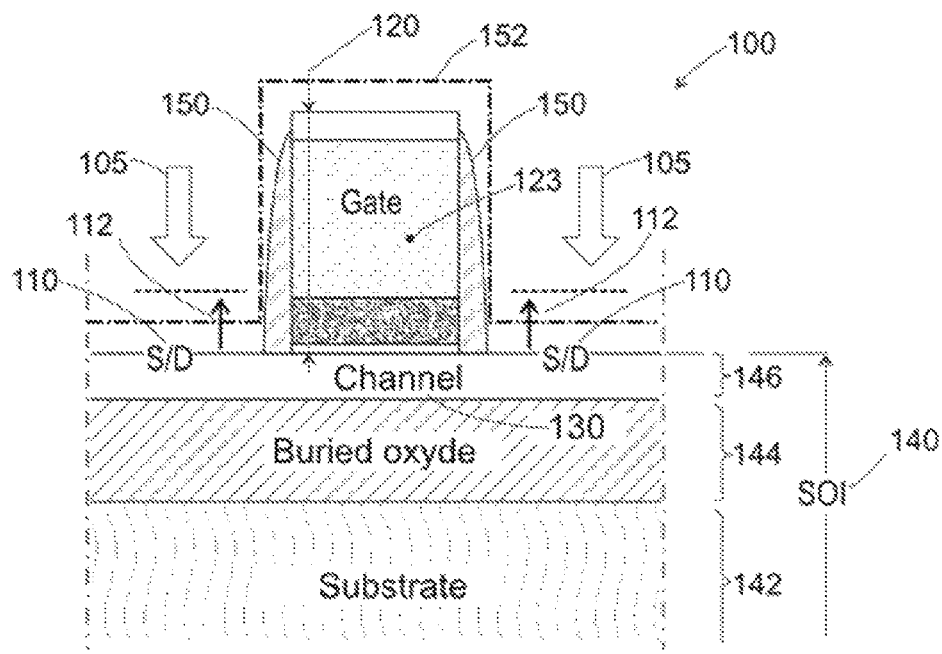
FIG. 1 illustrates a cross-sectional view of an exemplary MOSFET transistor of the FDSOI type being produced.

The drawings attached are given as examples and are not limiting to the invention. Such drawings are schematic representations and are not necessarily to scale with a practical application. More particularly, the relative thickness of the various layers and substrates are not a representation of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate whereon the lower layer has been deposited. Thickness is thus generally measured along a vertical direction in the figures shown. On the contrary, the thickness of a layer covering a flank of a pattern is measured along a direction perpendicular to such flank.

In a conventional way, the dielectric constant of a layer can be measured by for example the so-called mercury drop.

It should be recalled that according to one aspect, the invention relates to a method of forming spacers of a field effect transistor gate, the gate being located over an active layer of a semi-conductor material, the method comprising:
- at least a step of forming a protection layer covering the gate of the said transistor, the protection layer being a layer based on nitride (N) and/or silicon (Si) and/or carbon, the dielectric constant of which being equal to or less than 8 and preferably equal to or less than 7;
- at least a step of modifying the protection layer by contacting the protection layer with a plasma in which CxHy is introduced where x is the proportion of carbon and y is the proportion of hydrogen (H) and comprising ions heavier than the hydrogen; the conditions of plasma, in particular the concentration of CxHy, the ion energy and the main implantation direction are so chosen that:
  - the plasma creates a bombardment with hydrogen-based ions (H, $H^+$, $H_2^+$, $H_3^+$ etc.) stemming from CxHy, with the bombardment being anisotropic in a favorite (i. e., privileged or main) direction parallel to flanks of the gate and so as to form a modified protection layer by modifying an upper portion of the thickness of the protection layer at the level of the flanks of the gate only, and so as to keep non-modified portions of the protection layer covering the flanks of the gate,
  - plasma chemical species containing carbon from CxHy form a carbon-containing film in particular on surfaces parallel to the direction of the bombardment;
  - the plasma creates a bombardment with ions heavier than hydrogen which prevents said carbon-containing chemical species of the plasma and stem ing from CxHy from forming a carbon-containing film, more particularly on the surfaces of the protection layer which are perpendicular to the direction of the bombardment;
- at least a step of removing the modified protection layer using a selective etching of the modified protection layer relative to non-modified portions of the protection layer.

Before making a detailed review of the embodiments of the invention, optional characteristics which may be used in combination or as alternative solutions are listed hereafter:

Advantageously CxHy is CH4.

The ions heavier than hydrogen in plasma which are selected among argon (Ar), helium (He), nitrogen (N2), xenon (Xe) and oxygen (O2) may be used alternately or combined in the same plasma. They are aimed at preventing the forming of the carbon-containing film at the bottom of the pattern. Other ions may be used.

The hydrogen-based ions are preferably selected among: H, $H^+$, $H_2^+$, $H_3^+$.

During said step of modifying the protection layer, the flow of CxHy in the plasma ranges from 2% to 50% of total flow and preferably from 8% to 40%. Beyond this, it will be in a deposition mode. The dilution depends on the choice of species of the plasma, He, N2, Ar or O2 etc. For example:
- for He or Ar, the flow of CxHy should be less than 10% of the total flow;
- for N2, the flow of CxHy should be less than 20% of the total flow;
- for O2, the flow of CxHy should be less than 50% of the total flow.

During said step of modifying the protection layer, the concentration of ions heavier than the hydrogen in the plasma ranges from 50% to 98%.

Advantageously, this concentration allows ensuring an efficient modification of the protection layer by the hydrogen-based ions while allowing forming a carbon-containing film that protects the flanks of the gate. Such concentrations also allow the ions heavier than the hydrogen to prevent the forming of carbon-containing film which would tend to form on all the surfaces. Furthermore, such concentrations allow to efficiently dissociate the CxHy molecule in order to release the species H.

According to one embodiment, the parameters of implantation, more particularly the energy transmitted to ions, the duration and the dose of implantation, as well as the nature of the ions are so selected that the modified portions of the layer to be etched can be selectively etched relative to the carbon-containing film. Such parameters are also so set that the modified portions of the layer to be etched can be selectively etched relative to the non-modified portions of the layer to be etched. Such parameters are also so set that the modified portions of the layer to be etched can be selectively etched relative to the layer underlying the layer to be etched.

In one embodiment, the protection layer is preferably nitride-based layer such as a layer of silicon nitride.

In another embodiment, the protection layer has or comprises a material having a dielectric constant less than 4 and preferably less than 3.1 and preferably less than or equal to 2, which thus allows reducing the parasitic capacitance and improving the performance of the transistor. For example, the material of the protection layer is selected among: the SiCO, the SiC, the SiCN, the SiOCN, the SiCBN, the SiCBO, the SiOCH, the cBN (cubic boron nitride) and the SiO2.

This allows reducing the parasitic capacitance and improving consequently the performance of the transistor.

The step of removing the modified protection layer is preferably executed using wet etching selectively to carbon, to the non-modified portions of the protection layer, and/or said semi-conductor material of the active layer and/or to the silicon oxide (SiO2). In this case the modified protection layer is very easily consumed relative to the consuming of carbon, to the semi-conductor material of the active layer (typically silicon) and/or to silicon oxide (SiO2).

In one embodiment where the protection layer is a nitride-based layer an embodiment of the invention provides in fact a hydrofluoric acid (HF)-based etching solution which consumes the nitride at a speed of 0.5 nm/minute and with a selectivity of the nitride relative to silicon approximately ranging from 20 to 30.

Besides, the selectivity of the modified nitride relative to carbon and to the non-modified nitride is respectively above 100 and 30.

Selectivity and thus etching accuracy can thus be significantly improved.

Excessive consuming of the active layer and the layer comprising carbon and exposing the flanks of the gate or forming feet are thus avoided.

Other optional characteristics of the invention, which may be associated according to any combination or alternately, are mentioned hereafter:

Advantageously, the protection layer is a porous layer. In the scope of the present invention, the name of porous layer is applied to a layer wherein the presence of void is larger than 5% and preferably comprise between 5 and 10%.

Advantageously, the protection layer is a non-porous layer.

Advantageously, the step of forming the protection layer comprises a step of depositing the protection layer during which the polarisability of the protection layer is reduced so as to reduce the dielectric constant of such layer. According to one preferred embodiment, for this purpose, bindings less polar than the bindings forming the material of the base of the protection is used.

The step of forming the protection layer comprises a step of depositing the protection layer during which a step of reducing the dielectric constant of the protection layer is performed. The step of reducing the dielectric constant of the protection layer comprises introducing porosity in the protection layer. Alternatively or combined with the introduction of a porosity, the step of forming the layer to be etched comprises introducing precursors in the layer to be etched during depositing. If the layer to be etched is a silicon nitride-based layer, then the precursors are for example chosen so as to form bonding less polar than the silicon nitride, such as the Si—F, the SiOF, the Si—O, the C—C, the C—H and the Si—CH3.

Advantageously, the step of modifying is so executed that the plasma generates an anisotropic bombardment with ions heavier than hydrogen according to a main direction parallel to the flanks of the gate, so as to prevent said carbon from CxHy from forming a carbon-containing film on the surfaces perpendicular to the flanks of the gate.

Advantageously, the step of modifying is so executed that the ions heavier than hydrogen of plasma dissociate the CxHy molecule so as to enable the hydrogen-based ions from CxHy to be implanted into said portions of the protection layer. The hydrogen-based ions from the CxHy molecule are thus dissociated by the plasma heavy ions. It could be noted that helium (He) is particularly efficient to obtain such dissociation of CxHy. The mixture thus comprises a CxHy/He mixture.

Advantageously, the step of removing the modified protection layer is advantageously executed by selective etching of the active layer.

Advantageously, the step of modifying the protection layer by the hydrogen ions modifies the integrity of the protection layer at the top of the gate and both sides of the gate.

Advantageously, the step of modifying the protection layer by the hydrogen ions does not modify the protection layer on the flanks of the gate.

Advantageously, the carbon containing chemical species of the plasma and originating from CxHy form a carbon-containing film only on the flanks of the gate.

Advantageously, during the step of modifying the conditions of plasma, more particularly the concentration of CxHy, the ion energy and the main implantation direction are so selected that, at the level of the surfaces perpendicular to the implantation direction, the whole thickness of the protection layer is modified by the implantation of hydrogen-based ions. The step of removing is so executed as to remove the whole thickness of the modified protection layer, thus exposing the active layer at the level of the surfaces perpendicular to the implantation direction.

Advantageously, the step of modifying is so executed as to only modify an upper portion of the thickness of the protection layer at the level of the flanks of the gate.

Advantageously, the thickness e2 of the carbon-containing film covering the walls of the layer comprising carbon is twice the thickness e1 of the carbon-containing film on the flanks of the gate.

Alternately, the step of removing is executed using selective dry etching of said modified protection layer relative to said carbon-containing film, relative to the non-modified portions of the protection layer and relative to said semi-conductor material. Besides, dry etching does not remove silicon oxide (SiO2) forming a hard mask at the top of the gate either.

The semi-conductor material is preferably silicon, and the step of removing the modified protection layer is executed by selective dry etching to silicon (Si).

Preferably, dry etching is executed in plasma formed in a confined enclosure from nitrogen trifluoride (NF3) and ammonia (NH3).

According to a particularly advantageous embodiment, implanting and removing the protection layer are executed in the same plasma reactor. Modifying the layer to be removed by plasma implanting thus makes it possible to modify and etch the layer in the same chamber, which is very advantageous as regards the simplification, the time required for the execution, and the cost of the method.

Advantageously, dry etching comprises a step of etching consisting in forming solid salts; and a step of sublimating solid species. Such embodiment makes it possible to obtain a very good selectivity of the etching of the modified protection layer relative to the non-modified portions and to the non-modified semi-conductor material. More particularly, such selectivity of the etching is much higher (typically a factor 10 at least) than the one obtained with a HF solution.

Preferably but not restrictively, the method comprises several sequences, each comprising a step of modifying and a step of removing, and wherein, during at least one of the steps of modification, a part of the thickness of the protection layer only is modified.

The sequences are repeated until the modified protection layer has disappeared on all the surfaces parallel to the plane of a substrate whereon the gate is supported.

In one embodiment, the step of modifying is a single step so executed as to modify the entire thickness of the protection layer over all the surfaces parallel to the plane of a substrate whereon the gate is supported and not to modify the protection layer throughout its thickness on the surfaces perpendicular to this plane. Such embodiment enables a particularly accurate control of the dimensions of spacers.

Preferably but not restrictively, the step of modifying is preceded by a step of anisotropic etching which is executed in a plasma of the CH3F/O2/He type. Such embodiment makes it possible to remove a large amount of the protection layer in one step and then to adjust the control of thickness on the flanks during a second step. Such embodiment thus saves production time.

The gate of the transistor is located on a stack of layers forming a complex substrate of the silicon-on-insulator (SOI) type.

The step of removing is executed using etching of the modified protection layer selectively to the carbon-containing film.

The semi-conductor material is selected among: silicon (Si), germanium (Ge), silicon-germanium (SiGe). The step of removing the modified silicon protection layer is executed using wet etching selectively to Ge or to SiGe or and/or to SiGe oxide or Ge oxide.

The step of modifying executed from plasma continuously modifies the protection layer from the surface of the protection layer and on a thickness ranging 1 nm to 30 nm and preferably from 1 nm to 10 nm.

According to a non-limitative embodiment, the transistor is a transistor of the FDSOI or FinFET types.

As mentioned above, one object of the invention consists in remedying all or at least some of the above-mentioned problems.

Figure 3:
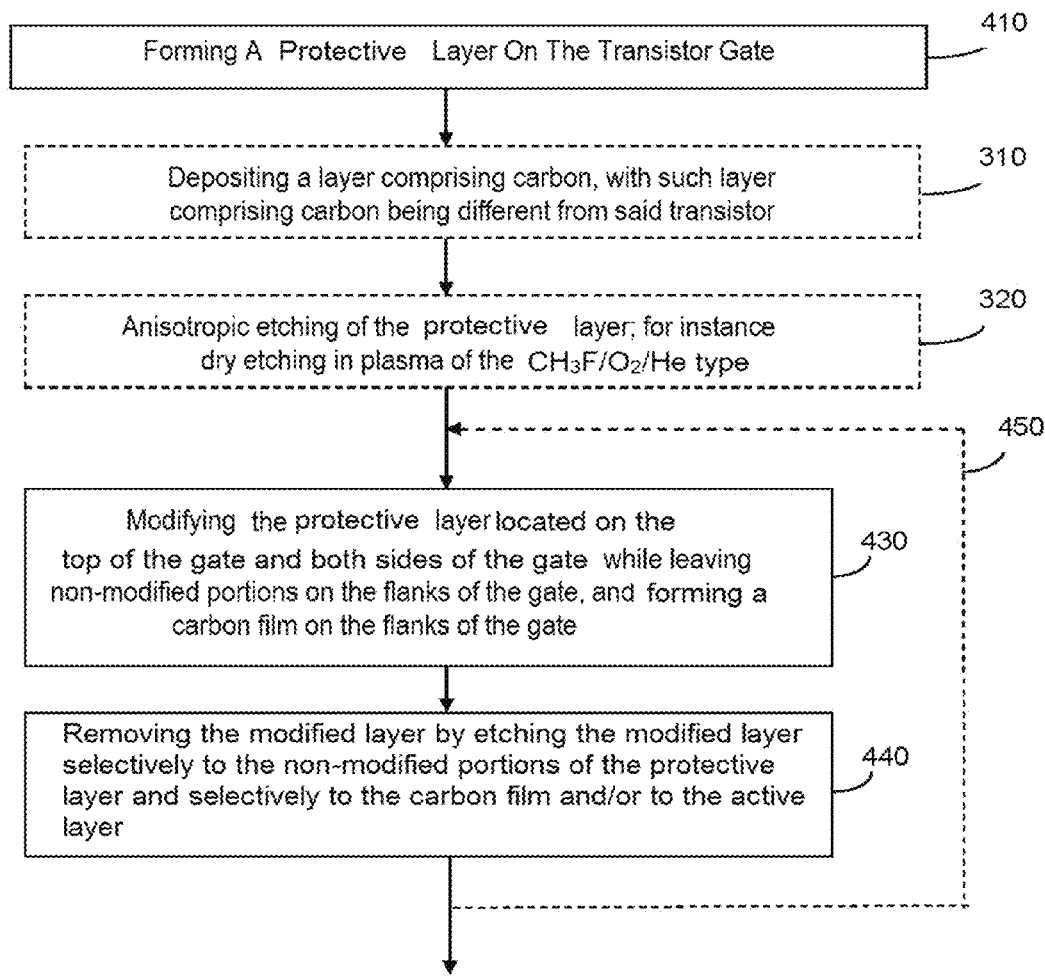
FIG. 3 summarizes the main steps of one exemplary method for forming spacers of a transistor according to the invention applied to the production of transistors.

FIG. 3 summarizes the mains steps 410 to 440 of a detailed example of a method for forming spacers for a transistor according to the invention. Such steps 410 to 440 may also be applied to forming spacers on the flanks of the gates of various transistors: FDSOI, FinFET, etc. The steps 410 to 440 will be respectively explained in greater details in the following paragraphs relating to FIGS. 4a to 4d et 5a to 5e respectively illustrating a structure of a transistor 200 obtained upon completion of steps 410 to 440 according to one embodiment of the invention.

Figure 4A:
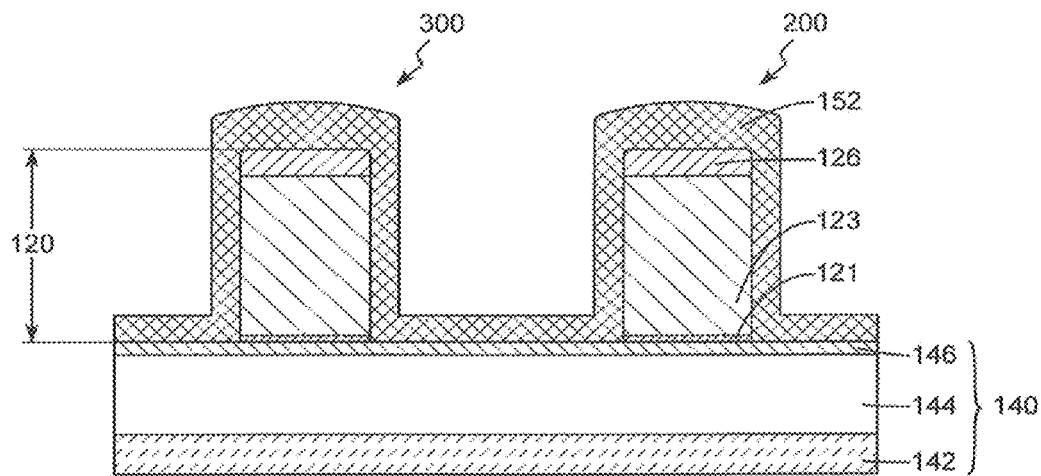
FIGS. 4a to 4d illustrate the structures of a transistor obtained upon completion of some steps of the method according to one embodiment of the invention.

FIG. 4a illustrates a structure obtained upon completion of the step of forming 410 a protection layer 152 covering a transistor 200 formed on a substrate 140 of the SOI type comprising an active layer 146 topped with a gate 120 of the transistor 200.

Forming a transistor 200 consists in producing a complex substrate 140 of the SOI type, from a substrate 142, often called a bulk substrate, an initial insulating layer 144 and the active layer 146, with the latter being intended to subsequently form a conduction channel of the transistor 200.

Alternatively, the semi-conductor material is selected among: the germanium (Ge), the silicon-germanium (SiGe).

In addition to the layer of polycrystalline silicon 123, a thin insulating gate oxide layer 121 can first be found in the stack of layers forming the gate 120, through which an electric field will be able to develop for creating an underlying conduction channel between source and drain when a sufficient electric voltage is applied to the gate 120.

In the most recent MOSFET transistors, a so-called "high-k/metal gate" technology is implemented, i.e. the dielectric layer 121 is made of a high permittivity (high-k) insulating material covered by a metal gate represented by the layer 120 (not illustrated on the figures). At this stage, the stack of layers of the gate 120 also includes a protective hard mask 126 that will be removed later to enable the recovery of contact on this electrode. Such hard mask 126, which remains in place after etching the gate, is typically made of silicon oxide (SiO2). It aims at protecting the top of the gate 120 from any damage when executing the next steps and specifically those of the spacer etching.

The dielectric layer 121 is preferably placed in contact with the active layer 146 forming the conduction channel. The metallic layer is preferably in contact with the dielectric layer 121. The polycrystalline silicon layer 123 is preferably positioned directly in contact with the oxide of the gate formed by the dielectric layer 121 if la metallic layer is absent or is positioned directly in contact with the metallic layer.

A structure 300 different from the transistor 200 is preferably but not restrictively formed, prior to the step of forming 410 protection layer 152, on the substrate 140 whereon the gate 120 is supported.

The presence of such structure 300 is optional within the scope of the invention.

In this example, which is not restrictive, the transistor 200 is a NMOS transistor and the structure 300 is a PMOS transistor. In another embodiment, the transistor 200 is a PMOS transistor and the structure 300 is a NMOS transistor.

The step of forming 410 the protection layer 152, having a preferably substantially constant thickness, is so executed as to cover the transistor 200 and the structure 300, i.e. on all the surfaces, whether vertical or horizontal, of the devices being produced. This may be called a compliant deposition. Preferably, but not restrictively, the protection layer 152 is positioned directly in contact with the surfaces of the structures being produced.

Such step of forming 410 is preferably executed but not limited to using a so-called LPCVD deposition method, the acronym for "low pressure chemical vapor deposition". As a matter of fact, such type of deposition which is executed under atmospheric pressure enables a uniform deposition on all the surfaces whatever the orientation thereof.

Such protection layer 152 can be nitride (N)-based and/or silicon (Si)-based and/or carbon (C)-based. Its dielectric constant is equal to or less than 7.

The protection layer 152 is for example a layer of silicon nitride (SiN) the dielectric constant of which is equal to 8 and preferably equal to 7.

In an advantageous and non-restricted way, the protection layer 152 comprises a material of a low dielectric constant less than 4 and preferably less than 3.1 and preferably less than or equal to 2. For example, materials such as the SiCO, the SiC, the SiCN, the SiOCN, the SiCBN, the SiOCH, the c-BN, the boron nitride (BN) and the SiO2, are qualified « low-k » materials, that is, a low constant of dielectric. The material of the protection layer 152 selected among the « low-k » materials as the above thus enables to reduce the parasitic capacitance improving thereby the performance of the transistor.

However, the invention is not restricted to examples of materials mentioned above. The protection layer 152 can be other materials with a low dielectric constant less than or equal to 8 and preferably less than or equal to 7.

In an advantageous embodiment, the protection layer 152 is a porous layer. Alternatively, the protection layer 152 is a non-porous layer.

Preferably, the material of the protection layer 152 is compatible with dry-cleaning or wet-cleaning executed in a subsequent step 440 for removing a modified protection layer 158, such step will be described below.

The thickness of the protection layer 152 is preferably high enough for non-modified portions 152a, 152b of the protection layer 152 to remain at the level of the flanks of the gate 120, after executing the steps of modifying 430 and removing 440.

In a preferred embodiment, the thickness of the protection layer 152 ranges from 5 m to 30 nm, preferably 10 nm.

Preferably but only optionally, the method of the invention comprises an optional step of reducing the dielectric constant of the protection layer 152. According to an advantageous embodiment, reducing the dielectric constant is obtained during the step of depositing the protection layer 152.

According to an embodiment, reducing the dielectric constant comprises introducing in the protection layer 152 in the course of being formed precursors which form bondings reducing the polarisability of the layer 152. Such precursors are so selected as to generate bondings less polar than the silicon nitride, such as the Si—F, the SiOF, the Si—O, the C—C, the C—H, and the Si—CH3.

According to another embodiment, which is alternative to or combinable with the previous embodiment, reducing the dielectric constant comprises introducing porosity in the protection layer 152 while said protection layer 152 is being formed.

Figure 4B:
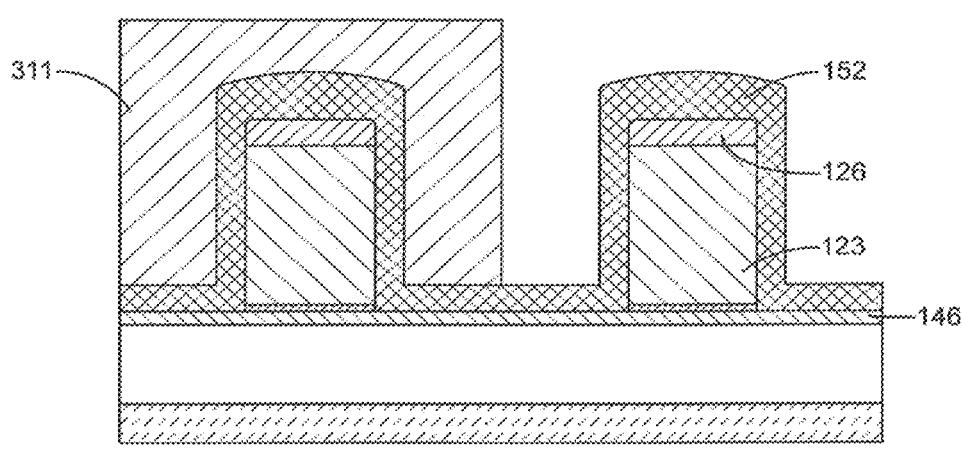

FIG. 4b illustrates the structure of the transistor 200 upon completion of an optional step of depositing 310 a layer 311 comprising carbon, with such layer 311 comprising carbon being different from said transistor 200.

In a preferred embodiment, the layer 311 comprising carbon is so configured as to cover the structure 300 different from said transistor 200, with the structure 300 and said transistor 200 being on the same substrate 140. Such layer 311 comprising carbon may be used as a protection for the structure it covers.

The layer 311 comprising carbon is preferably a layer of photo-sensitive or thermo-sensitive resin. In another embodiment, the layer 311 comprising carbon is a hard mask comprising carbon and preferably formed with carbon.

Figure 4C:
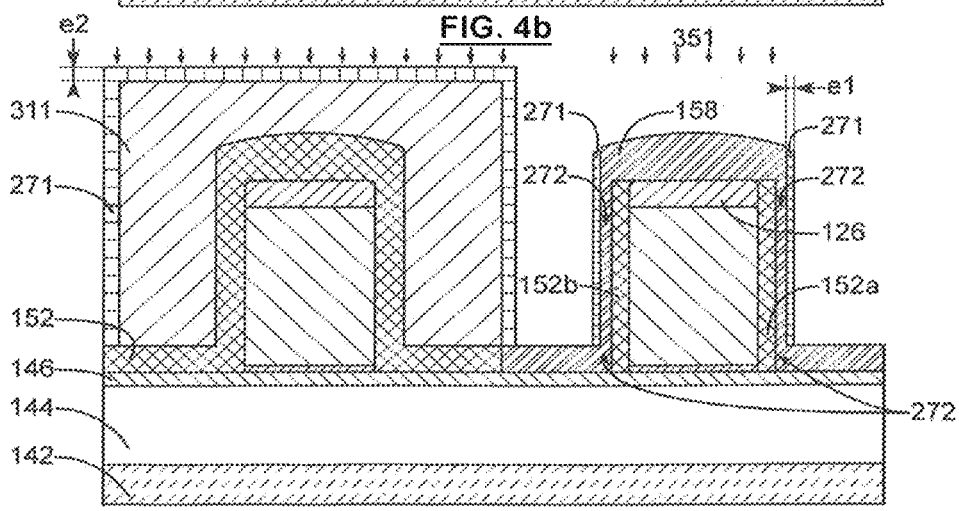

FIG. 4c illustrates the structure of the transistor 200 upon completion of the step of modifying 430 the protection layer 152 and forming a carbon-containing film 271.

The step of modifying 430 the protection layer 152 as formed upon completion of step 410, is executed by contacting the protection layer 152 with plasma comprising ions heavier than hydrogen and CxHy where x is the proportion of carbon and y is the proportion of hydrogen and ions heavier than hydrogen, so as to form a modified protection layer 158 and a carbon-containing film 271.

Thus, the plasma species fulfil three functions at least. Such three functions will be explained in greater details in the description hereunder.

《 a 》 deposition of a protective layer formed with the carbon-containing film 271, on the flanks of the gate 120 and on the layer 311 comprising carbon when it is present;

《 b 》 preventing the forming of the carbon-containing film 271 on the surfaces perpendicular to the flanks of the gate 120;

《 c 》 modifying the protection layer 152 on the entire thickness thereof, or on a significant thickness on the surfaces perpendicular to the flanks of the gate 120 and modifying the protection layer 152 on a smaller thickness on the flanks of the gate 120. Preferably, the protection layer 152 located on the top of the gate 120 and both sides of the gate 120 (i.e., beyond the flanks of the gate) is entirely modified whereas the protection layer 152 located on the flanks of the gate 120 is not modified or modified on a smaller thickness.

CXHy is introduces in the plasma for example of methane (CH4) in order to fulfil the 《 a 》 and 《 c 》 functions. The carbon-containing plasma chemical species from CH4 or more generally CxHy fulfil the 《 a 》 function. To fulfil the 《 b 》 function the plasma comprises ions heavier than hydrogen such as helium (He), argon (Ar), nitrogen (N2), xenon (Xe) and oxygen (O2). For brevity, such ions are hereafter called "heavy ions".

The 《 c 》 function is fulfilled by the hydrogen-based ions. The hydrogen-based ions are preferably selected among: H, $H^+$, $H_2^+$, $H_3^+$. In the following description, and for sake of concision, the hydrogen-based ions will be referred to as 《 hydrogen ions 》. Such ions have the property of easily and deeply penetrating into the protection layer 152. They thus modify the protection layer 152 without pulverising it. The heavy ions penetrate much less deeply into the protection layer 152. Such heavy ions remain on the surface and are thus not able to modify a significant thickness, and a fortiori the entire thickness, of the protection layer 152. The depth of penetration of the heavy ions is approximately ten times lower than the depth of penetration of the hydrogen ions.

More precisely, the hydrogen-based ions which may be implanted into the material to be etched, without causing any dislocation of its atomic structure which would cause the pulverizing thereof, and thus without any re-deposition of the material etched on the walls of the reactor or the patterns being etched, may be suitable.

An additional function is ensured by the heavy ions. Such additional function consists in dissociating the CxHy molecule in order to release the H species. Helium (He) is particularly efficient to fulfil such function. The mixture introduced into the plasma reactor thus preferably comprises a CxHy/He mixture.

It should be noted here that such step of modifying 430 the layer to be etched may be executed in many different ways by adapting all kinds of means currently used by the micro-electronics industry. Standard etchings are more particularly used, wherein high or low density plasmas may be developed and wherein the ion energy may be controlled in order to enable the implantation of the above light species intended to modify the layer to be etched. A so-called type of immersion plasma commonly used for implanting species at the surface of a device being manufactured can also be used.

The modifying executed by implantation using plasma advantageously enables the continuous implantation from the free surface of the protection layer 152 and on a low thickness, typically ranging from 0 to 100 nm or even from 0 to 30 nm. It also makes it possible to take advantage of improved selectivity as soon as etching is started, and of a constant etching speed, which leads to an improved etching accuracy.

Using plasma for implanting the protection layer 152 thus makes it possible to remove a very thin nitride layer, typically ranging from 1 to 10 nm and more generally from 1 to 30 nm.

Such step of modifying 430 is executed so that plasma can be anisotropic, so as to bombard the hydrogen-based ions in a favourite direction 351 parallel to the flanks of the gate 120. The plasma used during such step 430 creates a bombardment with hydrogen (H)-based ions from the CxHy molecule and implanting into an upper portion of the thickness of the protection layer 152 at the level of the flanks of the gate 120. Such hydrogen-based ions come from CxHy, the molecule of which is dissociated by the ions heavier than hydrogen in plasma.

The ions thus modify the surfaces perpendicular to the direction of the bombardment on a much higher thickness than the surfaces parallel to the direction of the bombardment. The upper portion of the thickness of the protection layer 152 at the level of the flanks of the gate 120 is modified on a smaller thickness than the surface at the top of the gate 120 and the surfaces of the protection layer 152 covering the active layer 146, A non-modified thickness 152a, 152b of the protection layer 152 covering the flanks of the gate 120 is preserved and will become spacers 152a, 152b.

Hydrogen-based ions thus penetrate the protection layer 152 to modify it. At the same time, the plasma CxHy, preferably CH4, tends to deposit a carbon-containing film 271 onto the different walls.

The bombardment with ions heavier than hydrogen enables carbon-containing species from CxHy to form the carbon-containing film 271, in particular on the surfaces parallel to the bombardment direction while preventing forming a carbon-containing film 271 on the surfaces of the protection surfaces 152 which are perpendicular to the bombardment direction 351, such as the bottom of the trenches. As a matter of fact, the plasma heavy ions pulverize the carbon-containing species from CxHy which would tend to form on such walls perpendicular to the implantation direction and thus prevent the growth of such carbon-containing film 271 on such walls perpendicular to the implantation direction.

On the contrary, such carbon-containing film 271 forms on the surfaces which receive a lesser, or no bombardment. It is in particular formed on the surfaces parallel to the bombardment direction 351.

It should be particularly advantageously noted that the carbon-containing film 271 acts as a carbon protective layer for the protection layer 152 that it covers, thus reducing the thickness whereon the hydrogen ions penetrate the protection layer 152 and modify the latter. The carbon-containing film 271 thus makes it possible to increase the difference in modification thickness between the surfaces covered by the carbon-containing film 271 and the surfaces which are not covered. The etched thickness is thus better controlled.

During said step of modifying the layer to be etched, the concentration of CxHy in the plasma preferably ranges from 2% to 50% of total flow and preferably ranges from 8% to 40%. Beyond this, it will be in deposition mode. The dilution will depend on the choice of species of the heavy ions of the plasma, He, N2, Ar or O2 etc. For example:

for He or Ar, the flow of CxHy should be less than 10% of the total flow;

for N2, the flow of CxHy should be less than 20% of the total flow;

for O2, the flow of CxHy should be less than 50% of the total flow.

During said step of modifying the protection layer, the concentration of ions heavier than the hydrogen in the plasma ranges from 50% to 98%.

During said step of modifying the layer to be etched, the concentration of ions heavier than the hydrogen in the plasma ranges from 50% to 98%. Such concentrations are usually measured by a ratio between the two gas components.

In the present patent application, a ration between two gas components is a ratio of the respective flows of introducing these two components in the plasma reactor. Each flow is usually measured in sccm. Typically a flow is measured with a flow meter associated to the reactor.

In one embodiment (as illustrated above) using He/CH4 plasma preferably as a mixture, the protection layer 152 is modified by the H ions from CH4 gas. The He ions destroy or prevent the forming of the carbon-containing film 271 which would tend to form on the surfaces perpendicular to the direction 351 such as the surfaces of modified protection layer 158 covering the active layer 146 and the hard mask 126 at the top of the gate 120.

In another embodiment using H2/CH4/Ar, in addition to hydrogen ions, the nature of Argon ions and the parameters of plasma, more particularly the energy thereof, make it possible to ensure an anisotropic depletion of the methyl groups of the carbon-containing film 271 so that the carbon-containing film 271 is not formed on the surfaces perpendicular to the direction 351 as above.

Thus, Argon, possibly alone, makes it possible to prevent the forming of the carbon-containing film 271 on the surfaces perpendicular to the direction 351 of the bombardment. When combined with He, N2, Xe and/or O2, it participates in pulverizing the carbon-containing film 271 which would tend to form.

Thus, Ar, He, N2, Xe or O2 heavy ions make it possible to reinforce the action of the hydrogen-based ions by also preventing the forming of the carbon-containing film 271 on the surfaces perpendicular to the main direction of the bombardment.

It should be noted here that in all such embodiments, the H ions of CH4 participate, in synergy, with the heavy ions of plasma (He, Ar, N2, Xe or O2 for example) in the modification of the portion 158 of the protection layer 152, even though the depth of penetration of such heavy ions is smaller than that of the hydrogen-based ions.

Thus, upon completion of such step of modifying 430, the carbon-containing film 271 only covers the surfaces of the protection layer 152 which are perpendicular or significantly sloping relative to the plane of the substrate 140, such as the upper surfaces of the modified protection layer 158 at the level of the flanks of the gate 120 and the walls or flanks of the layer 311 comprising carbon.

It should be noted, quite surprisingly, that the carbon-containing film 271 forms on the walls of the layer 311 comprising carbon. The plasma ions do not pulverize the carbon-containing film 271 formed on the walls of the layer 311 comprising carbon. This probably results from the chemical affinity and molecular reactions between the carbon of the layer 311 and the carbon-containing chemical species from CxHy. Such affinity makes it possible to quickly reach a deposition rate and favours the forming of the carbon-containing film 271 on the layer 311 comprising carbon. The carbon-containing film 271 thus quickly forms, in spite of the bombardment with heavy ions Such carbon-containing film thus acts as a protective layer for the layer 311 comprising carbon and prevents any damage to the latter by the ionic bombardment. The dimensions of the layer 311 are thus kept in spite of the ionic bombardment.

Because of the above molecular reactions, the thickness e2 of the carbon-containing film 271 covering the walls of the layer 311 comprising carbon is higher that the thickness e1 of the carbon-containing film 271 on protection layer 152 (at the level of the flanks of the gate 120). Even more advantageously, the thickness e2 of the carbon-containing film 271 is at least twice as high as the thickness e1 of the carbon-containing film 271. Thicknesses e1 and e2 are shown in FIG. 4c.

Thickness e1 of the carbon-containing film 271, as measured on a flank of the gate 120 and perpendicularly to the flank, is preferably very thin, for example ranging from 1 to 5 nm, preferably 1 nm.

Thickness e2 of the carbon-containing film 271, as measured on the layer 311 comprising carbon and parallel to the implantation direction, is preferably 5 nm or ranging from 1 to 10 nm.

The carbon-containing film 271 formed on the layer 311 comprising carbon is thus thicker than the one on the protection layer 152 because of the chemical reactions between the carbon of the layer 311 and the carbon from the plasma CxHy.

The thickness e2 of the carbon-containing film 271 formed on the layer 311 comprising carbon enables the latter to resist the anisotropic bombardment with ions executed as above. Quite surprisingly, such reinforced or thickened carbon-containing film 271 thus makes it possible to protect the layer 311 comprising carbon during the step of modifying 430 as well as during the step of removing 440 even on the surfaces perpendicular to the bombardment direction 351.

The carbon-containing film 271 thus acts as a protective film for the insulating layer 311 comprising carbon, preventing or reducing the modification of the latter as a result of the ionic bombardment.

It should be noted here that such step of modifying 430 the layer to be etched may be executed in many different ways by adapting all kinds of means currently used by the micro-electronics industry, such as with the help of all etching type, for example in a ICP reactor, that is « Inductively » Coupled Plasma or in a CCP type reactor, that is, « Capacity Couple Plasma » which allows controlling the energy of ions. A so-called type of immersion plasma is commonly used for implanting species at the surface of a device being manufactured can also be used.

To select the parameters of implantation, a person skilled in the art, in order to determine the behaviour of the material to be etched in the selected implanter type, will preferably do some « full » plate test (which means at a wafer scale) preliminarily in order to establish the curves of behaviour. The person skilled in the art will then deduced, more particularly the energy and the dose of ions, that is the time of exposition, to be used to achieve the desired thickness of the material to be modified.

For example, the table hereafter gives the typical conditions for implementing the step of modifying 430 the protection layer 152, realized using He/CH4 plasma, H2/CH4/Ar plasma, CH4/Ar plasma, CH4/N2, or CH4/N2/H2 plasma depending on the time in seconds and the bias power in watts, etc. Such conditions greatly depend on the thickness to the modified of the protection layer 152.

In the example below, the protection layer 152 is a nitride-based layer such as a silicon nitride layer.

| | |
|---|---|
| Etching reactor: | ICP or CCP reactor or immersion He/CH4 plasma (He: 50-500 sccm, CH4: 5-15 sccm), or H2/CH4/Ar plasma or H2/CH4/N2 plasma (H2: 50-500 sccm, CH4: 5-15 sccm, Ar (Argon) or N2: 100-1,000 sccm) |
| Thickness of the protection layer 152 to be modified (thickness of the modified protection layer 158): | 1 - a few tens of nm, for example 6-10 nm |
| Source power: | 0-2,000 Watts |
| Bias power (ions energy): | 20-500 V |
| Pressure: | 5 milli Torr-10 milli Torr |
| Temperature: | 10-100° C. |
| Time: | A few seconds to a few hundreds of seconds |

A more precise exemplary implementation of the step of modifying 430 making it possible to modify a 17 nm thickness of nitride, using He/CH4 plasma, is described in the table hereunder:

| | |
|---|---|
| Etching reactor: | He/CH4 plasma (He: 250 sccm, CH4: 10 sccm) |
| Thickness of the nitride-based layer 152 to be modified (thickness of the nitride-based modified portion 158): | 17 nm. |
| Source power: | 500 W |
| Bias power (ions energy): | 250 V |
| Pressure: | 10 milli Torr |
| Temperature: | 60° C. |
| Time: | 60 seconds |

Another more specific example of implementing the step of modifying 430 allowing modifying a thickness of 15 nm of SiCBO using a He/CH4 plasma is described in the table below:

| | |
|---|---|
| Etching reactor: | He/CH4 plasma (He: 250 sccm, CH4: 10 sccm) |
| Thickness of the protection layer 152 to be modified (SiCBO): | 15 nm |
| Source power: | 500 W |
| Bias power (ions energy): | 250 V |
| Pressure: | 10 milli Torr |
| Temperature: | 60° C. |
| Time: | 60 seconds |

The protection layer 152 is preferably modified on the entire thickness thereof, above the gate 120 and above the active layer 146 while leaving non-modified portions 152a, 152b of the protection layer 152 at the level of the flanks of the gate 120.

Figure 4D:
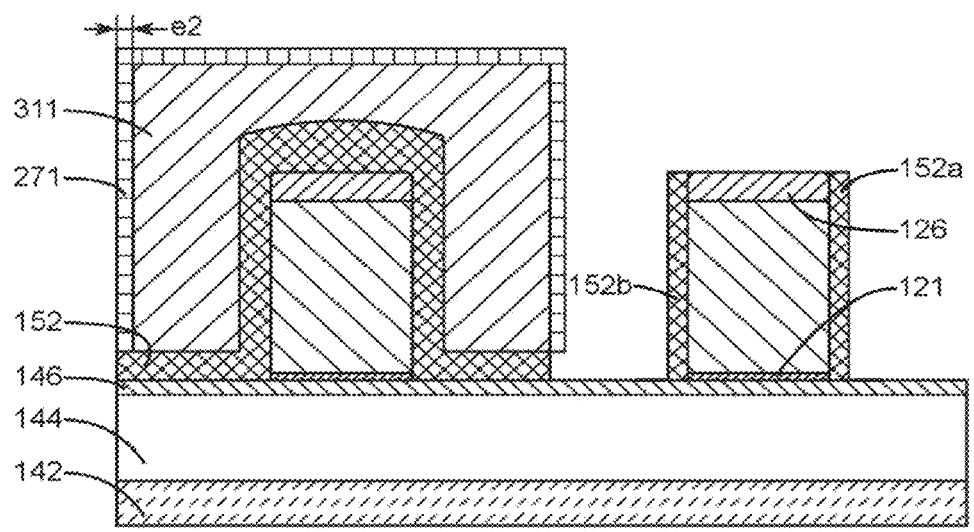

FIG. 4d illustrates the result of the step of removing 440 the modified protection layer 158 after executing selective etching of the modified protection layer 158 relative to: the carbon-containing film 271, to the non-modified portions 152a, 152b of the protection layer 152 and to the active layer 146.

The etching solution thus etches the modified protection layer 158 which it directly accesses on the top of the gate 120 and at the bottom of the trenches.

In the case where the hydrogen-based ions are implanted in the protection layer located on the flanks of the gate, which can be the case if the carbon-containing film 271 is thin, a thickness of the protection layer located on the flanks of the gate is thus modified.

During the step of removing, the etching solution is also introduced into the space located on the flanks of the gate 120, between the carbon-containing film 271 covering the flanks and the non-modified portions 152a, 152b. In this space, occupied by a modified protection layer 158 obtained upon completion of the step of modifying 430, the etching solution consumes the modified protection layer 158. The passages taken by the etching solution to consume such portion of the modified protection layer 158 are referenced 272 in FIG. 4c.

In this case, the carbon-containing film 271 is no longer supported and disappears. Typically such disintegration of the carbon-containing film is qualified as « lift off », namely removing by lifting.

Alternatively, in the case where the hydrogen-based ions are not implanted in the protection layer located on the flanks of the gate, which can be case if the carbon-containing film 271 is sufficiently thick, the protection layer located on the flanks of the gate is not modified or modified very little. Therefore during the step of removing, the solution of etching does not remove the protection layer 152 located on the flanks. So it does not disappear during the step of removing. This embodiment is not illustrated in the figures.

The carbon-containing film 271 having a thickness e2 advantageously protects the layer 311 comprising carbon during such step of removing 440.

Besides, the etching solution advantageously does not consume or slightly consumes the layer 311 comprising carbon. The execution of the step of removing 440 thus does not result in consuming the layer 311 comprising carbon.

Advantageously, the parameters of the step of removing are also so adjusted that the modified protection layer 158 can be etched selectively to a layer made of an oxide typically an oxide of said semi-conductor material, with the latter forming for example a gate oxide layer. Typically, the selective etching of the modified protection layer 158 does not consume silicon oxide SiO2.

Advantageously, such parameters are also so adjusted that the modified protection layer 158 can be etched selectively relative to the semi-conductor material of the active layer 146. Preferably, the step of removing 440 is executed using wet etching with a hydrofluoric acid (HF)-based etching solution.

In an embodiment wherein the modified protection layer 158 is typically a nitride-based layer, the step of removing 440 can be realized using wet etching with an etching solution based on hydrofluoric acid (HF) or phosphoric acid (H3PO4 for the SiC or the SiN.

Figure 2A:
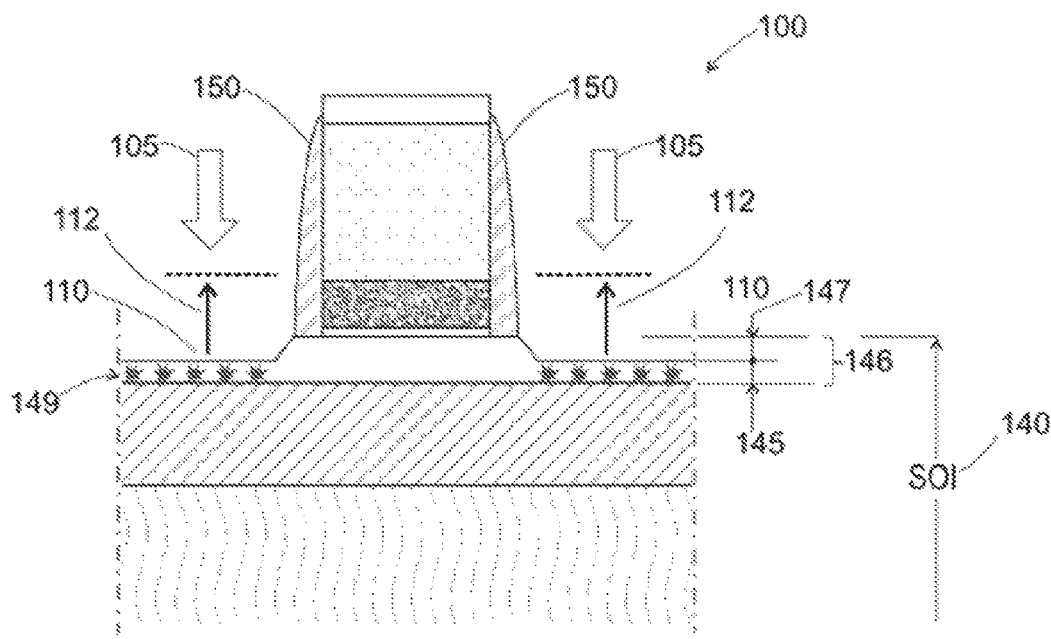
FIGS. 2a to 2c illustrate different defects which may be observed on FDSOI transistors structures upon etching spacers using either one of the standard anisotropic etching methods developed by the microelectronics industry.

To avoid the problems of the conventional methods for etching spacers described in FIGS. 2a à 2c, etching the modified protection layer 158 must be as selective as possible as regards silicon, more particularly in order not to consume the silicon of the active layer 146. For example, in such wet etching embodiment, the silicon of the active layer 146 is not consumed thanks to the utilisation of the hydrofluoric acid (HF) etching solution.

As mentioned above, the thickness of the modified protection layer 158 is typically within a range of values ranging from 1 nm to a few tens of nm. Etching time may range from a few seconds to a few minutes while being, of course, directly dependent on the thickness which has been modified.

For example, in order to remove a modified thickness between 5 nm and 20 nm of modified nitride, about 30 seconds are required, with a hydrofluoric acid (HF) solution, which is diluted to 1%. The same etching time is obtained with phosphoric acid (H3PO4) diluted to 85% to etch a silicon nitride (SiN) layer or a SiC layer.

A hydrofluoric acid (HF) solution can be used for protection layers based on materials other than the nitride, the silicon and the carbon.

For example, to remove a modified thickness of 15 nm of modified SiCBO, about 30 seconds are required, with a hydrofluoric acid (HF) solution, which is diluted to 1%.

Said selective etching can thus stop on the non-modified portions 152a, 152b of the protection layer 152 and/or on the single-crystal silicon of the active layer 146 and/or on the hard mask 126 at the top of the gate 120, until the modified protection layer 158 has disappeared.

Wet etching is preferably used for removing the modified protection layer 158, which combines removing the modified protection layer 158 with wet cleaning of the wafer containing the devices being produced, since, upon completion of wet etching, wet cleaning is conventionally executed to clean a wafer whereon the transistor 200 is positioned.

Such wet etching is preferably combined with wet cleaning, which simplifies the process and saves time.

Wet cleaning parameters are also so adjusted that the modified protection layer 158 can be etched selectively to the carbon-containing species of the carbon-containing film 271 more particularly covering the walls of the layer 311 comprising carbon, and to the non-modified portions (the obtained spacers) 152a, 152b of the protection layer 152.

Instead of wet etching, dry etching of the modified protection layer 158 selectively to the silicon of the active layer 146, to the material of the spacers 152a, 152b, to the silicon oxide (SiO2) of the hard mask 126 may also be executed for such step of dry removing 440 of the modified protection layer 158.

Figure 6:
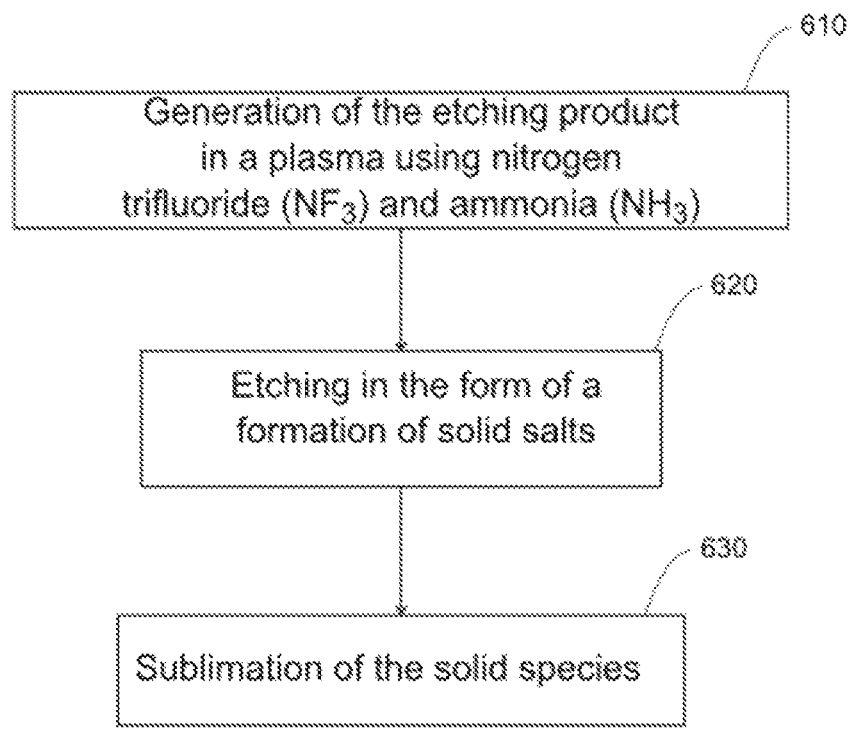
FIG. 6 illustrates the steps of dry removing the modified protection layer.

The principle of removing, using a dry process, the modified protection layer 158 typically a nitride-based modified layer 158 comprises the following steps 610 to 630 illustrated in FIG. 6 which are executed in a reaction chamber wherein plasma is formed. The processed thicknesses are typically between 1 nm and a few tens of nanometers.

This method is the one disclosed by H. Nishini and all in a publication in English entitled « Damage-free selective etching of Si native oxides using NH3/NF3 and SF6/H2O down flow etching » published in the « Journal of Applied Physics » volume 74 (2), in July 1993.

The principle of removing, using a dry process, the modified protection layer 158 is close to the one disclosed in the publication above. They are different in that, in the case of the invention, silicon oxide is not etched, but the modified protection layer 168 is, using plasma of, for instance, the H2/CH4/Ar type.

However, the mechanism is the same and comprises the following steps which are executed in a reaction chamber wherein plasma is formed. A first step 610 consists in generating the etching product in plasma according to the following chemical reaction:

$NF_3 + NH_3 \rightarrow NH_4F + NH_4F \cdot HF$ which makes nitrogen trifluoride (NF3) react with ammonia (NH3).

Etching is executed during a second step 620, at a temperature of about 30° C. and more generally between 10° C. and 50° C., as the forming of salts according to the following chemical reaction:

$NH_4F \text{ or } NH_4F \cdot HF + SiNH \rightarrow (NH_4)_2SiF_6(\text{solid}) + H_2$ during an operation which last from a few seconds to a few minutes and which is executed under a pressure ranging from a few milli Torrs to a few Torrs. More precisely, such operation lasts from 20 seconds to 2 minutes and is executed under a pressure ranging from 500 milli Torr to 3 Torrs.

The solid species which are formed during such operation are then sublimated 630 at a temperature above 100° C. for a few tens of seconds according to the following reaction:

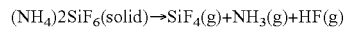

$(NH_4)_2SiF_6(\text{solid}) \rightarrow SiF_4(g) + NH_3(g) + HF(g)$

For example, to remove a layer of 10 nm of modified nitride 158 the flux of nitrogen trifluoride (NF3) and of ammonia (NH₃) are respectively 50 sccm and 300 sccm at 30° C. for 45 seconds for the step 620 of forming salts which is followed by the step of sublimating 630 which is executed at 180° C. for 60 seconds.

Such embodiment makes it possible to obtain a very good selectivity of the etching of the modified protection layer 158 relative to the non-modified portions 152a, 152b and to the non-modified semi-conductor material. More particularly, such selectivity of the etching is much higher (typically a 10 factor at least) than the one obtained with a HF solution.

Upon completion of the step of removing 440, the non-modified portions 152a, 152b of the initial protection layer 152 only remain, mainly on the flanks of the stack of layers which form the gate 120. Such non-modified portions 152a, 152b constitute the spacers 152a, 152b for the gate 120 of the transistor 200 for example of the FDSOI type. Besides, etching the modified protection layer 158 can also be executed for producing the spacers of a three-dimensional transistor of the FinFET type, such FinFET application being only a non-limitative example of the invention.

The result of FIG. 4d may be the result of a single step of modifying and a single step of removing or of a plurality of sequences comprising such steps. As a matter of fact, the operations of modifying 430 the protection layer 152 and of removing 440 the modified protection layer 158 can optionally be repeated 450. The sequences comprising each a step of modifying 430 and a step of removing 440 are executed until the modified protection layer 158 outside the flanks of the gate 120 is totally removed. The number of sequences is computed according to the etching speed of the first sequence.

Additional steps may also be, for example, standard steps wherein extensions of the source/drain zones may be executed by ionic implantation of dopants prior to the epitaxial growth of raised source/drain of FDSOI transistors.

As mentioned above, the embodiment illustrated in FIGS. 4a to 4d shows the production of the spacers 152a, 152b of the transistor 200 for example of the PMOS type, without consuming the layer 311 comprising carbon covering the structure 300 such as a transistor of the NMOS type, so as to prevent the layer 311 comprising carbon from being damaged when executing the steps of modifying 430 and removing 440.

The method of the invention may be applied to produce microelectronic devices on the same substrate whereon none of the devices being produced is covered and protected by a protective layer such as the layer 311 comprising carbon.

Figure 5A:
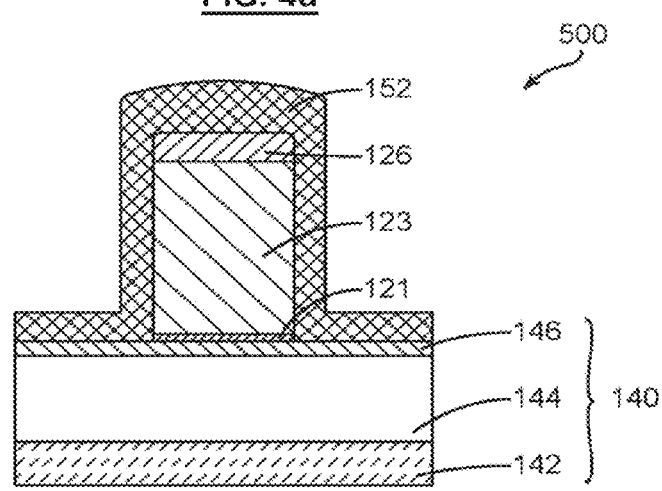
FIGS. 5a, 5b, 5d and 5e respectively illustrate a structure of a transistor obtained upon completion of a step of a method according to another embodiment of the invention.
Figure 5B:
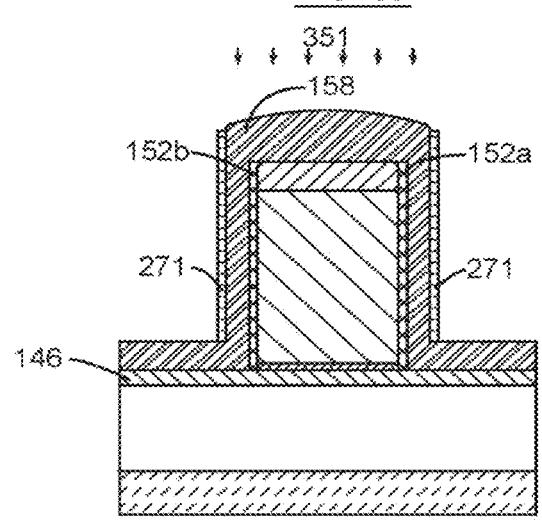
Figure 5C:
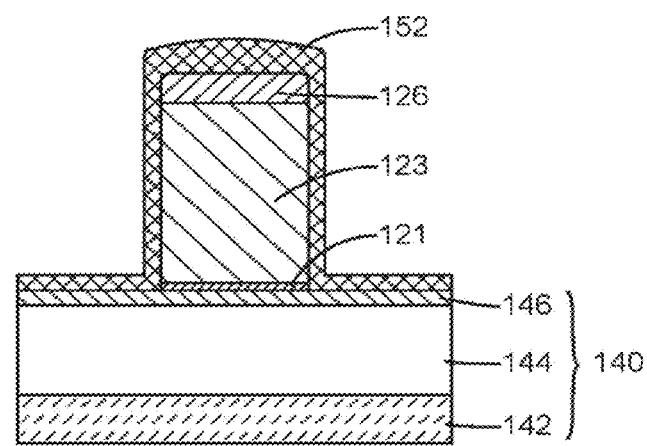
Figure 5D:
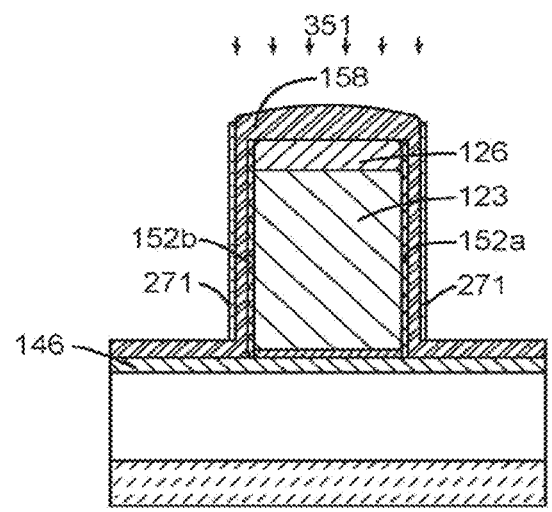
Figure 5E:
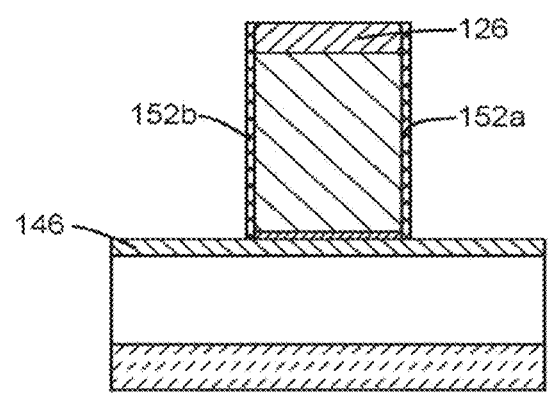

Another embodiment without any deposition of a layer 311 comprising carbon is illustrated in FIGS. 5a, 5b and 5e.

FIG. 5a illustrates a structure obtained upon completion of the step of forming 410 a protection layer 152 covering a transistor 500 formed on a substrate 140 of the SOI type comprising an active layer 146 topped with a gate 120 of the transistor 500.

The original structure of the transistor 500 is similar to that of the transistor 200 as illustrated in FIG. 4a.

Such step of modifying 410 is not different from the one illustrated above while referring to the embodiment described in FIGS. 4a to 4d.

The detailed description of the original structure of the transistor 500 and of the step of forming 410 is thus omitted in order to avoid a redundant description.

In the present embodiment, no step of depositing a layer comprising carbon (such as the layer 311 as described earlier) is executed to cover another structure previously formed on the substrate 140.

FIG. 5b illustrates the structure of the transistor 500 upon completion of the step of modifying 430 according to the present embodiment.

According to this embodiment, the step of modifying 430 is a single step so executed as to modify the whole thickness of the protection layer 152 over all the surfaces parallel to the plane of a substrate whereon the gate 120 of the transistor 500 is supported and not to modify the protection layer 152 throughout its thickness on the surfaces perpendicular to this plane.

The type of plasma used and the conditions of execution of such step of removing 430 are similar to those of the step 430 of the embodiment illustrated above in FIGS. 4a to 4d.

Upon completion of such step of modifying 430, the carbon-containing film 271 thus formed only covers the surfaces perpendicular to the plane of the substrate 140, such as the upper surfaces of the modified protection layer 158 on the flanks of the gate 120.

The carbon-containing film 271 is preferably very thin, for example ranging from 1 to 5 nm, preferably 1 nm.

As in the above mentioned embodiment illustrated in FIGS. 4a to 4d, the carbon-containing film 271 of the present embodiment is not formed on the surfaces perpendicular to the direction 351 because of the anisotropic bombardment with He or Ar.

FIG. 5e illustrates the final structure upon completion of the step of removing 440 the modified protection layer 158 according to the present embodiment.

Such step of removing 440 is executed to etch the modified protection layer 158 by etching selectively to the non-modified portions 152a, 152b of the protection layer 152, and/or to the semi-conductor material of the active layer 146 and/or to the silicon oxide (SiO2) of the hard mask 126 at the top of the gate 120. Such step of removing may be combined with a standard step of cleaning to simplify the method, which saves time.

Etching is also selective to the carbon-containing chemical species, typically the carbon, of the carbon-containing film 271. When the modified protection layer 158 disappears from the flanks of the gate 120, the carbon-containing film 271 having a very low thickness (for example 1 nm) is however disintegrated since it is no longer supported.

The type of selective etching and the conditions of execution of such step of removing 440 are similar to those of the step 440 of the embodiment illustrated above in FIGS. 4a to 4d.

Another embodiment without any deposition of a layer 311 comprising carbon is illustrated in FIGS. 5a, 5c to 5e.

The present embodiment starts with the step of forming 410 a protection layer 152 covering a transistor 500, as illustrated above in FIG. 5a.

FIG. 5c shows the structure of the transistor 500 obtained upon completion of an optional step of anisotropic etching 320 of the protection layer 152.

Optionally, after the step of forming 410 the protection layer 152 and prior to the step of modifying 430 the protection layer 152, an anisotropic etching 320 of the protection layer 152 is executed. This is typically executed in plasma of the CH3F/O2/He type disclosed above. In this optional and not restrictive embodiment, the spacers are thus etched in two steps comprising: a first step called « main etching » executed isotropically, and a second step of finishing, generally called « over etching (OE) » . Removing the protection layer 152 remaining on the horizontal surfaces will be completed during the step of over-etching (steps 440), after modifying (step 430) the protection layer 152 so as to avoid, or limit the problems described in FIGS. 2a to 2c.

Within the scope of specific implementations of the invention, it may be decided to keep or not the step of anisotropic etching 320, and the following steps then apply either to the protection layer 152, as deposited, or on the remaining protection layer after the main etching is executed, as in the standard method for etching spacers.

The next step to be executed is the step of modifying 430 the protection layer 152 remaining after the step of anisotropic etching 320. The structure of the transistor 500 upon completion of such step 430 is illustrated in FIG. 5d.

Such step of modifying 430 is not different from the one of the embodiment illustrated above in FIGS. 5a, 5b and 5e nor from the one of the embodiment illustrated above in FIGS. 4a to 4d.

The step of removing 440 the modified protection layer 158 is then executed, as illustrated in FIG. 5e. Such step of removing 440 is not different from the one of the embodiment illustrated above in FIGS. 5a, 5b and 5e nor from the one of the embodiment illustrated above in FIGS. 4a to 4d. Such embodiment makes it possible to quickly remove a high thickness of modified protection layer using isotropic etching and then to accurately control the thickness of the spacers executing steps 430 and 440.

In some applications, a very accurate control of « facetting » is required, i.e. the problem disclosed in FIG. 1d, which results from conventional etching operations and which may thus be induced by the main step of etching 320 which is optional, as seen above. Advantageously, to remedy such problem, such step will be avoided and substituted with repeated 450 operations for modifying 430 the protection layer 152 and for removing 440 the modified protection layer 158, with removing being preferably dry removing in this case as described in FIG. 6 since, as noted above, both operations may be executed in the same etching reactor.

Many advantages provided by the invention are disclosed in the above description. The method of the invention more particularly enables an anisotropic modification selectively to carbon, to the non-modified portions of the protection layer which constitute spacers for the gate and to a semiconductor material such as silicon.

A carbon-containing film formed during the step of modifying of the method resists the bombardment with the ions of plasma, which makes it possible to protect the layer comprising carbon during the step of modifying as well as during the step of removing.

The method of the invention is particularly advantageous to form the spacers for the transistors of the MOSFET or FinFET types.

Figure 2B:
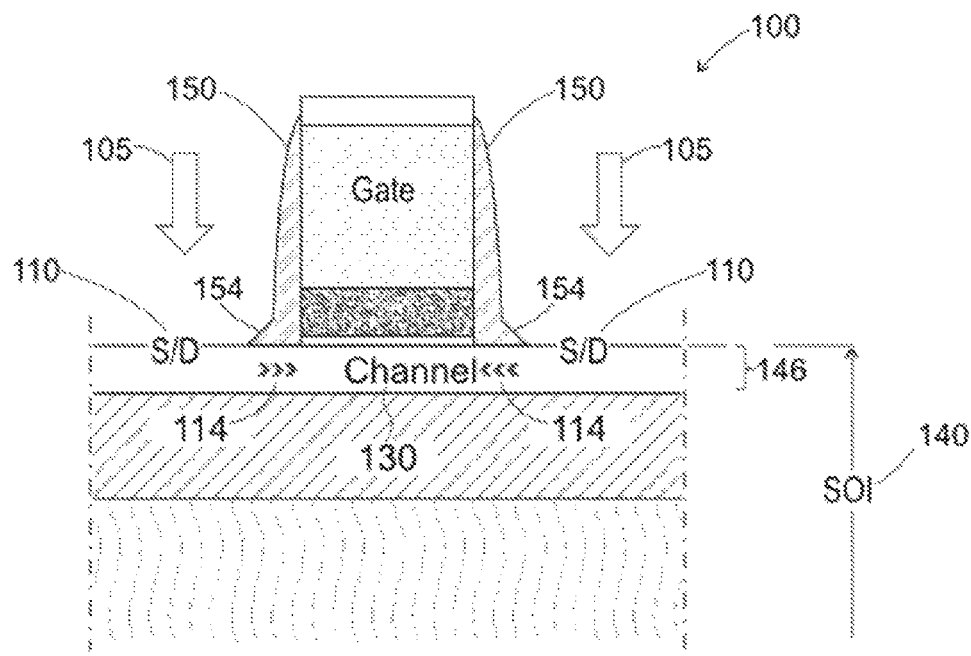
Figure 2C:
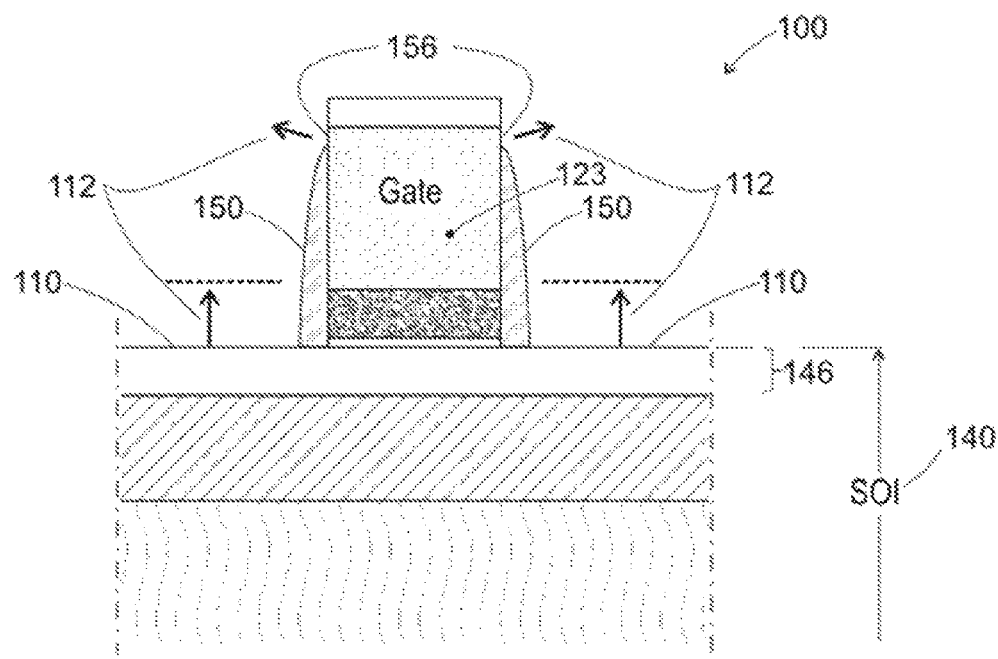

The method of the present invention makes it possible to very accurately control the dimensions of the spacers while remedying or reducing the problems mentioned in greater details above, i.e.: the excessive consuming of the active layer and/or of a carbon mask or a layer of photo-resist typically comprising carbon, the forming of feet at the level of the spacers of the gate, at the interface with the SOI substrate as described in FIGS. 2a and 2b, as well as the erosion of the gate spacers as described in FIG. 2c.

The invention is not limited to the embodiments described hereabove only but applies to any embodiment within the scope of the claims.

The invention claimed is:

1. A method for forming spacers of a field effect transistor gate, with the gate comprising a top and flanks and being disposed above an active layer made of a semiconductor material, the method comprising:
    forming a protection layer covering the gate, the protection layer being a layer based on at least one of a nitride, silicon, and carbon, and having a dielectric constant equal to or less than 8;
    modifying the protection layer by contacting the protection layer with a plasma into which $C_xH_y$ is introduced, where x and y are positive integers representing a respective number of carbon and hydrogen atoms in a molecule of the $C_xH_y$, the plasma comprising ions heavier than hydrogen, and conditions of plasma, including a concentration of the $C_xH_y$, an energy of ions of the plasma, and a main implantation direction being chosen such that the modifying comprises:
        bombarding the protection layer with hydrogen ions from the $C_xH_y$ in the plasma, the bombardment being anisotropic in the main implantation direction and being parallel to the flanks of the gate, which modifies portions of the protection layer located on the top of the gate and sides of the gate and keeps non-modified portions of the protection layer covering the flanks of the gate,
        forming a carbon-containing film on surfaces parallel to the main implantation direction, where carbon in the carbon-containing film is from the $C_xH_y$, and
        bombarding the protection layer with the ions heavier than hydrogen, which prevents the $C_xC_y$ from forming the carbon-containing film on surfaces of the protection layer that are perpendicular to the main implantation direction; and
    removing the modified protection layer by selective etching of the modified protection layer relative to non-modified portions of the protection layer.

2. The method according to claim 1, wherein a dielectric constant of the protection layer is less than 4.

3. The method according to claim 1, wherein the protection layer is a nitride based layer.

4. The method according to claim 1, wherein the protection layer is a silicon based layer.

5. The method according to claim 1, wherein the protection layer is a carbon based layer.

6. The method according to claim 1, wherein the protection layer is made of a material selected from: SiCO, SiC, SiCN, SiOCN, SiCBN, SiOCH, CBN, BN, Si—CBO, and $SiO_2$.

7. The method according to claim 1, wherein the protection layer is a porous layer.

8. The method according to claim 1, wherein the protection layer is a non-porous layer.

9. The method according to claim 1, wherein the forming the protection layer comprises:
    depositing the protection layer; and
    reducing a dielectric constant of the protection layer during the depositing.

10. The method according to claim 9, wherein the reducing the dielectric constant of the protection layer comprises introducing a porosity into the protection layer.

11. The method according to claim 9, wherein the forming the protection layer further comprises introducing precursors into the protection layer during the depositing.

12. The method according to claim 1, wherein the forming the protection layer comprises:
    depositing the protection layer;
    reducing a dielectric constant of the protection layer during the depositing; and introducing precursors into the protection layer during the depositing, wherein the protection layer is a silicon nitride-based layer, and wherein the precursors are selected so as to form bindings that are less polar than those of silicon nitride.

13. The method according to claim 12, wherein the precursors are selected from: Si—F, SiOF, Si—O, C—C, C—H, and Si—CH$_3$.

14. The method according to claim 1, wherein during said modifying the protection layer, the concentration of C$_x$H$_y$ ranges from 2% to 50%.

15. The method according to claim 1, wherein during said modifying the protection layer, a concentration of the ions heavier than hydrogen in the plasma ranges from 50% to 98%.

16. The method according to claim 1, further comprising, prior to the modifying, depositing a layer comprising carbon, the layer comprising carbon being different from said carbon-containing film, wherein said selective etching is selective of the modified protection layer relative to carbon and relative to non-modified portions of the protection layer.

17. The method according to claim 16, wherein the layer comprising carbon is a layer of photo-sensitive resin or thermo-sensitive resin.

18. The method according to claim 17, wherein the layer comprising carbon is deposited to cover a structure different from a transistor for which the spacers are formed.

19. The method according to claim 18, wherein said transistor is a NMOS transistor and said structure is a PMOS transistor, or wherein said transistor is a PMOS transistor and said structure is a NMOS transistor.

20. The method according to claim 17, wherein, during the modifying, the carbon-containing film covers walls of the layer comprising carbon, with a thickness of the carbon-containing film covering the walls of the layer comprising carbon being higher greater than a thickness of the carbon-containing film at a level of the flanks of the gate.

21. The method according to claim 16, wherein the layer comprising carbon is a hard mask.

22. The method according to claim 21, wherein the hard mask is formed with carbon.

23. The method according to claim 1, wherein the C$_x$H$_y$ is CH$_4$.

24. The method according to claim 1, wherein the ions heavier than hydrogen are selected from among argon, helium, nitrogen, xenon, and oxygen.

25. The method according to claim 1, wherein the bombardment with the ions heavier than hydrogen is anisotropic in the main implantation direction and is parallel to the flanks of the gate, preventing the C$_x$H$_y$ from forming the carbon-containing film on surfaces that are perpendicular to the flanks of the gate.

26. The method according to claim 25, wherein the ions heavier than hydrogen of plasma dissociate C$_x$H$_y$ molecules so as to enable the hydrogen ions from the C$_x$H$_y$ to form the hydrogen-based ions and to implant the hydrogen-based ions into said modified portions of the protection layer.

27. The method according to claim 1, wherein the modifying modifies only an upper portion of a thickness of the protection layer at the level of the flanks of the gate by keeping a non-modified thicknesses of the protection layer at a level of the flanks of the gate.

28. The method according to claim 1, wherein the removing is executed by selectively etching the active layer.

29. The method according to claim 1, wherein the removing is executed by selectively etching the modified protection layer relative to the carbon-containing film.

30. The method according to claim 1, wherein during the modifying, the conditions of the plasma are selected such that, at a level of the surfaces perpendicular to the main implantation direction, a whole thickness of the protection layer is modified by implantation of the hydrogen-based ions, and wherein the removing is executed so as to remove a whole thickness of the modified protection layer, thus exposing the active layer at the level of the surfaces perpendicular to the main implantation direction.

31. The method according to claim 1, wherein the removing the modified protection layer is executed by wet etching.

32. The method according to claim 1, wherein the semiconductor material is silicon, and wherein the removing the modified protection layer is executed by wet etching selective to said semiconductor material of the active layer and/or to silicon oxide.

33. The method according to claim 32, wherein the wet etching is executed using a solution based on hydrofluoric acid.

34. The method according to claim 1, wherein the removing is executed by selective dry etching of said modified protection layer relative to said carbon-containing film, to the non-modified portions of the protection layer, and to said semiconductor material.

35. The method according to claim 34, wherein the selective dry etching is executed in plasma formed in a confined chamber from nitrogen trifluoride and ammonia.

36. The method according to claim 34, wherein the selective dry etching comprises:

a step of etching consisting in forming solid salts; and a step of sublimating the solid species.

37. The method according to claim 1, comprising several sequences, each comprising a step of modifying and a step of removing, and wherein, during at least one of the steps of modifying, only a part of a thickness of the protection layer is modified.

38. The method according to claim 37, wherein the sequences are repeated until the modified protection layer has disappeared on all surfaces parallel to a plane of a substrate whereon the gate is supported.

39. The method according to claim 1, wherein the modifying is a single step executed so as to modify an entire thickness of the protection layer over all surfaces parallel to a plane of a substrate whereon the gate is supported, and to not modify an entire thickness of the protection layer on surfaces perpendicular to said plane.

40. The method according to claim 39, wherein the modifying is preceded by anisotropic etching executed in a CH$_3$F/O$_2$/He-type plasma.

41. The method according to claim 1, wherein the semiconductor material is selected from among: silicon, germanium, and silicon-germanium.

42. The method according to claim 1, wherein the modifying continuously modifies the protection layer from a surface of the protection layer and to a thickness of the protection layer ranging from 1 nm to 30 nm.

* * * * *